United States Patent
Bues et al.

(10) Patent No.: US 8,646,939 B2
(45) Date of Patent: Feb. 11, 2014

(54) DISPLAY SYSTEM HAVING CIRCADIAN EFFECT ON HUMANS

(75) Inventors: Matthias Bues, Stuttgart (DE); Oliver Stefani, Wetzikon (CH); Achim Pross, Stuttgart (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 238 days.

(21) Appl. No.: 13/141,924

(22) PCT Filed: Dec. 23, 2009

(86) PCT No.: PCT/EP2009/009259
§ 371 (c)(1), (2), (4) Date: Dec. 8, 2011

(87) PCT Pub. No.: WO2010/072415
PCT Pub. Date: Jul. 1, 2010

(65) Prior Publication Data
US 2012/0069551 A1 Mar. 22, 2012

(30) Foreign Application Priority Data
Dec. 23, 2008 (DE) .......... 10 2008 062 819

(51) Int. Cl.
*F21V 9/08* (2006.01)
*G09G 3/16* (2006.01)

(52) U.S. Cl.
USPC .......... 362/231; 362/97.1; 345/83; 345/102

(58) Field of Classification Search
USPC .............. 362/97.1–97.4, 230, 231, 458, 234, 362/253; 349/61; 345/76–83, 102
See application file for complete search history.

(56) References Cited

U.S. PATENT DOCUMENTS

| | | | |
|---|---|---|---|
| 7,920,137 B2 * | 4/2011 | Pietrasik | 345/102 |
| 8,240,875 B2 * | 8/2012 | Roberts et al. | 362/231 |
| 8,284,275 B2 * | 10/2012 | Abe | 348/240.99 |
| 8,456,483 B2 * | 6/2013 | Han | 345/77 |
| 2008/0204366 A1 | 8/2008 | Kane et al. | |
| 2008/0252580 A1 * | 10/2008 | Pietrasik | 345/88 |
| 2010/0188022 A1 * | 7/2010 | Gerlach et al. | 362/231 |

FOREIGN PATENT DOCUMENTS

EP 1813978 B1 8/2007
WO WO9701240 1/1997

OTHER PUBLICATIONS

English translation of International Preliminary Report on Patentability issued in PCT/EP2009/009259, mailed Jul. 21, 2011, 10 pages.

* cited by examiner

*Primary Examiner* — Bao Q Truong
(74) *Attorney, Agent, or Firm* — Faegre Baker Daniels LLP (57) ABSTRACT

A display system includes an illumination unit in which a predetermined light spectrum can be produced with the illumination unit, the average light intensity of which light spectrum can be reduced or increased over the wavelength range of 420 nm to 500 nm relative to the average light intensity above and below this wavelength range such that the predetermined light spectrum is greater relative to a light spectrum produced without this reduction or increase.

23 Claims, 8 Drawing Sheets

DISPLAY SYSTEM HAVING CIRCADIAN EFFECT ON HUMANS

CROSS-REFERENCE TO RELATED APPLICATIONS

The present application is a national phase application of PCT/EP2009/009259, filed pursuant to 35 U.S.C. §371, which claims priority to DE 10 2008 062 819.0, filed Dec. 23, 2008. Both applications are incorporated by reference herein in their entirety.

TECHNICAL FIELD

The present invention relates to a display system, such as a monitor, screen or projector, for optical display of text- and/or picture information, that is designed to influence the human circadian rhythm.

BACKGROUND

The organization of work at present frequently creates conditions which have a negative effect on human physiology. If, before the invention of the light bulb, people were forced to adapt to the daytime light rhythm, then the possibility has been created with the introduction of artificial light to establish the working rhythm by means of other specifications. Working in the early morning or late evening hours can thereby represent a certain problem, in particular in the winter months.

SUMMARY

In some embodiments, the present invention is directed to a display system that can have a positive influence on the working rhythm by having a concentration-increasing effect and/or fatigue-reducing effect. Furthermore, in some embodiments, the present invention pertains to a display system which, if at all, appears merely slightly colored and/or with a slight change in color when looking at the display and which, above all, changes the perception of the color white as little as possible.

The invention is now subsequently described firstly in general then with reference to embodiments. The combinations of features produced in the special embodiments need not thereby be produced precisely in the shown feature combination within the scope of the present invention (which is defined solely by the attached patent claims in their scope) but rather they can also be produced in other combinations of the features. In particular, individual ones of the shown features can also be produced alone, i.e. without the other individual features produced together with them in the embodiments.

Figure 1:
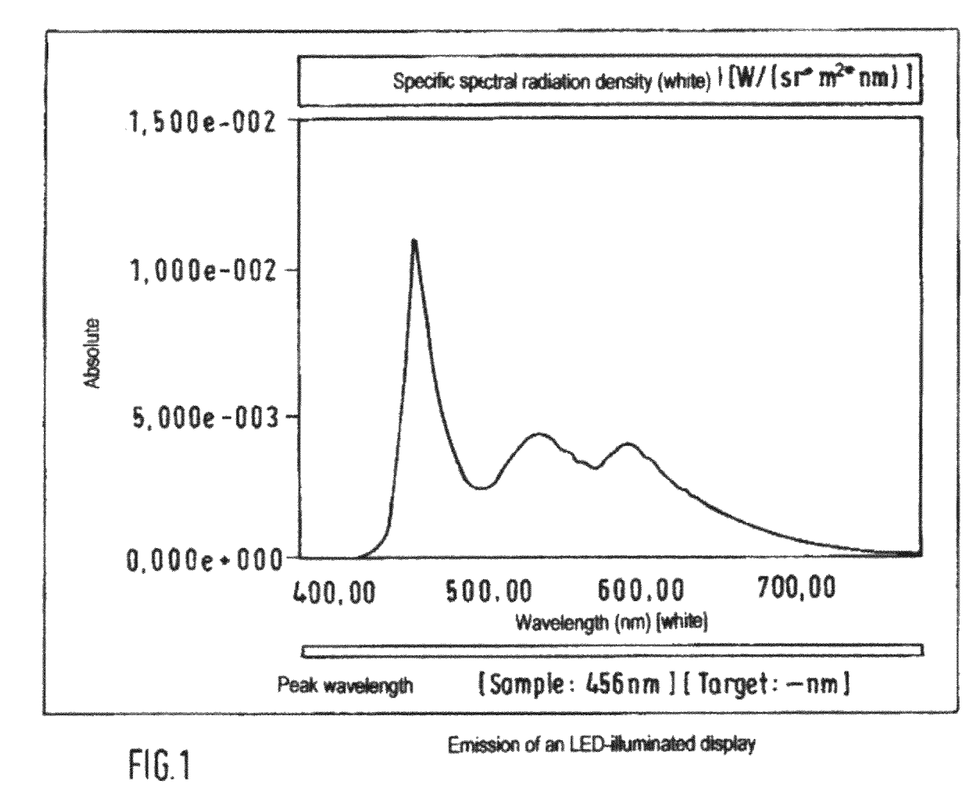
FIGS. 1 to 3 illustrate the basic considerations on which the present invention is based.

In some embodiments, the basic idea of the present invention is based on the observation that new displays, in particular LC displays (liquid crystal screens) with LED illumination or OLED displays, are very energy-efficient, on the one hand, and, on the other hand, make possible excellent color reproduction, these displays, in contrast to conventional CCFL-illuminated displays (cathode ray tubes), emit blue light with a very similar spectrum, as is absorbed in the eye by the circadian photoreceptors (cf. FIG. 1).

This makes it reasonable to suppose that the fatigue of the observer can be reduced or the concentration of the observer can be increased by such displays.

The biological area of influence of light differs significantly from the visual effect as light triggers the inner clock of humans according to daily, weekly and annual rhythms. The influence of the intrinsic body rhythm (for example circadian) by light is effected via skin and eyes. Communication with the various body systems is based on the secretion of the hormone melatonin into the blood circulation (Rea M.: "Light much more than vision" in: Light and Human Health, 5$^{th}$ International Lighting Research Symposium, Palo Alto, the Lighting Research Office of the Electric Power Research Institute, 2002, pp. 1-15).

In the eye there are three types of cones as photoreceptors that initiate the visual process during photopic vision (daytime vision). In addition there are the rods which enable scotopic vision (night-time vision, no perception of color). A sub-group of retinal ganglion cells contains the protein melanopsin; these likewise light-sensitive circadian photoreceptors are not used for vision but instead control the melatonin produced by the pineal gland (Baumeier D.: "Der Einfluss von Licht auf die Psyche", (The influence of light on the psyche), University of Leipzig, Dissertation, 2000).

Figure 2:
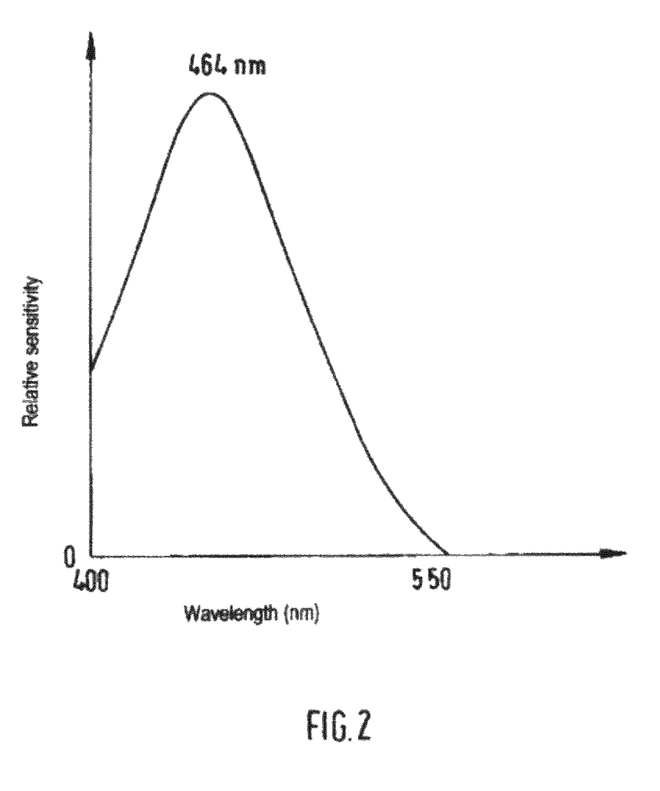

The sensitivity of this circadian photoreceptor as a function of the wavelength is shown in FIG. 2: here the relative sensitivity over the wavelength in nanometers is plotted; this displays a maximum of melatonin suppression and hence of the circadian activation at a wavelength of 464 nm, i.e. of approx. 460 nm, which corresponds to blue light (Brainard G. et al.: "Action spectrum for melatonin regulation in humans: Evidence for a novel circadian photoreceptor." Journal of Neuroscience 21 (2001), No. 16, p. 6405-6412; Thapan, K.: "An action spectrum for melatonin suppression: Evidence for a novel non-rod, non-cone photoreceptor system in humans.", Journal of Physiology, 535 (2001), No. 1, p. 261-267).

The production of melatonin is suppressed by the effect of light; melatonin triggers fatigue (an increase in melatonin is hence sleep-promoting) and hence controls the sleeping-waking rhythm and also other circadian rhythms (Wirtz-Justice A. et al.: "Circadiane and saisonale Rhythmen", (Circadian and seasonal rhythms), Zentrum für Chronobiologie, Psychiatrische Universitätsklinik Basel, Zentrum für Chronobiologie, Institut für Medizinische Psychologic, Munich, 2004). By means of the daily rhythm of light strength and light color, productivity or regeneration phases in humans are also supported. The influence of the time-provider light on the so-called endogenous oscillator also depends upon the time of day: if this is located in the daytime phase, it barely reacts to light stimulus, the rhythm moves backwards due to the effect of light at the beginning of the night and at the end of the night forwards. Even a slight illumination with white light (during exposure of guinea pigs during the night for several hours) shows a significant reduction in the melatonin suppression with subsequent illumination by monochromatic light.

Figure 3:
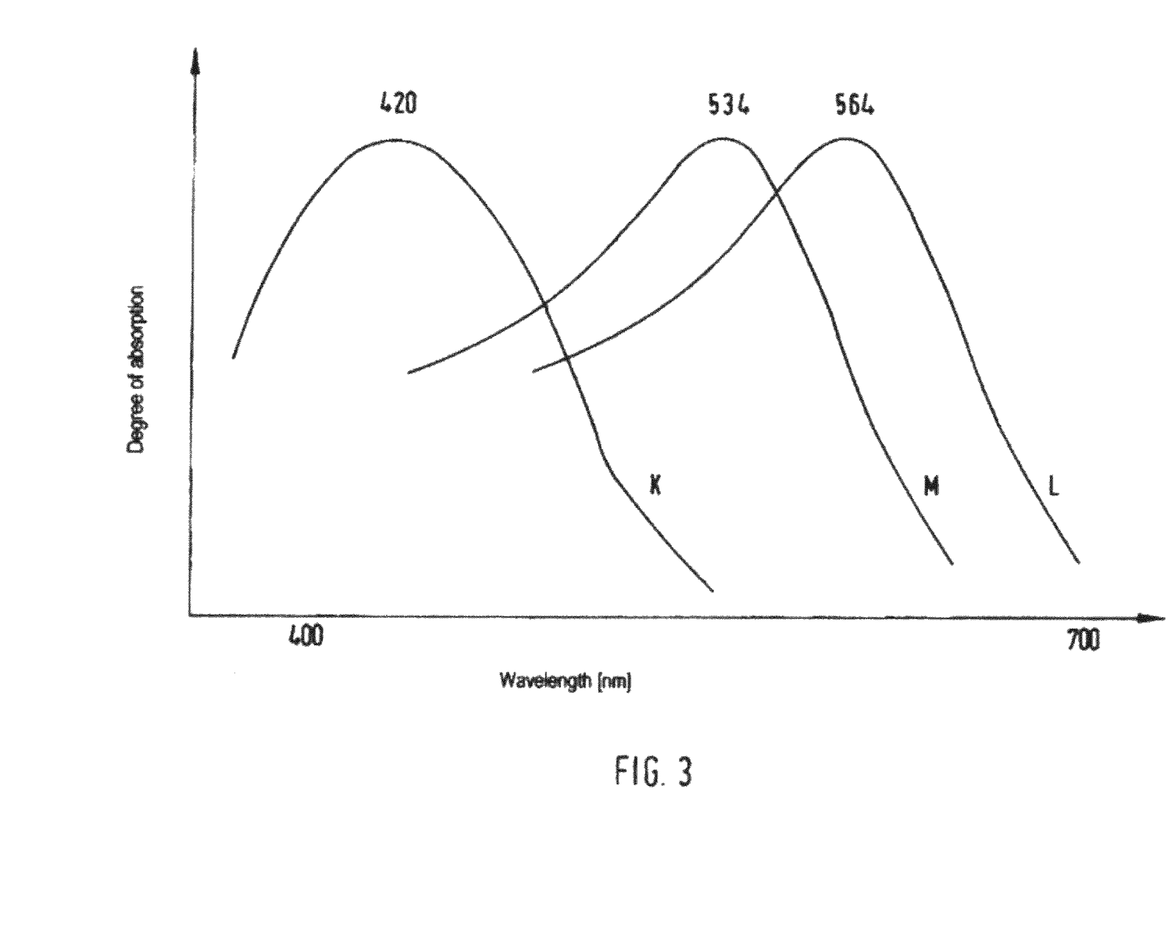

The color perception of humans forms a further essential basis of the present invention: the color perception of humans in the case of photopic vision (bright light) is primarily a reaction of the cones on the retina of the eye to incident light. Bright light excites the three types of cone in the eye (so-called K-, M-, L cones). The three absorption curves of the individual types of cone are thereby in the blue, in the green and in the red range (cf. FIG. 3 which shows the degree of absorption of the individual types of cone plotted over the wavelength in nanometers). Three specific signals are associated with each perceived color. If all three types of cone are excited equally, this is perceived by humans as white light. It can be concluded from this consideration that white light can be produced from different red, green and blue values (RGB values) as long as the intensities in the red, green and blue range respectively ensure the same excitation of the K-, M- and the L types of cone. It must thereby be taken into account that the actual, physical radiation flow of the 3 ranges red (R), green (G) and blue (B) are not of equal size since the types of cone are sensitive to different degrees (the highest sensitivity of the cones is for example at 555 nm).

It is hence essential that different light mixtures (i.e. different spectra) can appear the same to the human eye although the respective spectral composition in the visible range (i.e. approx. from 380 to 750 nm) is different. This fact or that different light spectra for a given type of light can produce the same color impression in humans is also termed metamerism. There are understood by metameric light spectra within the scope of the present invention, different light spectra (i.e. light spectra which differ over the above-mentioned wavelength range in their spectral composition or in the intensities of the individual wavelengths) which however appear the same to the human observer, i.e. cause the same color stimulus. There is hereby understood by color stimulus, the color sensitivity caused by direct stimulation of the retina of the eye because of the radiated physical radiation of visible light (i.e. because of the radiated light spectrum). The invention is described subsequently with the example of the RGB color space, the construction and properties of which are well known to the person skilled in the art (see for example CIE standard tables). Of course the present invention can however also be produced on the basis of other (additive) color spaces. For example, also more than three basic colors can be used for the color mixing, which leads to a greater covered area in the CIE color space. Also production on the basis of subtractive color models (for example by using an additional narrow band 464 nm band pass filter in front of the display area) is possible.

In some embodiments, a display system according to the invention includes firstly a display unit (e.g. LC screen or LCD) and an illumination unit that illuminates this display unit on the basis of an additive color synthesis (e.g. RGB colour synthesis) with a predetermined light spectrum (for example arrangement of a plurality of light diodes, LEDs, with different spectra in the blue, green and red range). Alternatively thereto, the illumination unit can also however form the display unit itself (as self-illuminating unit) (for example in the form of a two-dimensional array based on organic light diodes, so-called OLEDs).

In the first case (non-self-illuminating display unit), a predetermined light spectrum can then be produced with the illumination unit, the light intensity of which light spectrum is reduced in the wavelength range of approx. 420 nm to 500 nm which is crucial for the circadian effect (the range can also be chosen to be correspondingly narrower, cf. FIG. 2) relative to the light intensity above and below this wavelength range (or also only relative to the light intensity above or below this wavelength range) such that the predetermined light spectrum is metameric to a light spectrum produced without this reduction. Alternatively or cumulatively thereto, it is of course likewise possible to increase the light intensities above and/or below the wavelength range which is crucial for the circadian effect relative to the light intensity in this wavelength range such that metamerism, in comparison with the light spectrum produced without this increase (with physically corresponding light sources), is produced. The light intensity can thereby be the intensity averaged over a wavelength interval.

In the second case of the illumination unit configured as self-illuminating display unit (e.g. OLED screen), the individual elements (emitting layers of the individual OLED pixels), which are then also termed illumination sub-units in the scope of the present invention, are then configured such that they produce respectively the above-described, predetermined light spectrum.

This (relative) increase in light intensity in the circadian area of influence has the effect that the melatonin level is reduced via the described operating mechanism, which leads to an increased state of wakefulness.

Alternatively thereto, it is however also possible to reduce the light intensity in the wavelength range which is crucial for the circadian effect relative to the surrounding ranges. This then has the effect, in contrast to the above-mentioned intensity increase in the crucial wavelength range, of increasing the melatonin level and, resulting therefrom, a decrease in the state of wakefulness.

In a first embodiment, the relative intensity increase or intensity reduction in the crucial wavelength range from 420 nm to 500 nm (or narrower), is thereby at least 10%, at least 30%, at least 70% or at least 90% (the higher this value, the more do the above-mentioned effects occur).

For particular preference, the illumination unit has a plurality of individual light sources (e.g. in the case of an LED-illuminated LCD screen, the light diodes which illuminate the non-self-illuminating display unit or, in the case of an OLED screen, the emitting layers of the individual picture pixels) with respectively different light spectra, the different light spectra differing with respect to their maxima by at least a few 10 nm (the predetermined light spectrum can then be produced by additive superimposition with the individual light spectra of these light sources).

In some embodiments, the present invention can be produced by using, in addition to a light source which emits in the green and one in the red range (i.e. in the range of approx. 490 to 575 nm and of approx. 650 to 750 nm), a further light source which has an emission maximum in the range above 380 nm (i.e. in the blue range), however is thereby configured such that the relative intensity component of the light emitted by it in the wavelength range which is crucial for the circadian effect (420 nm to 500 nm or narrower) is as small as possible. For particular preference, a second light source which emits in the blue range is added to this further light source which emits in the blue range, which second light source has now however an emission maximum above the range which is crucial for the circadian effect and the relative intensity component of which (relative to the light emitted in total by it) in the range which is crucial for the circadian effect is likewise as small as possible.

These light sources, i.e. for example the four above-described light sources (e.g. light diodes for LCD screen illumination or OLED layers in self-illuminating screens), can be configured and disposed, within the scope of the invention, with suitable choice of the individual spectra such that the total spectrum (i.e. the predetermined light spectrum) which is produced with them (by additive superimposition) is metameric to a light spectrum which is produced by the additive superimposition of the spectra of normally used, corresponding light sources (e.g. three LEDs or OLED layers which emit in the red, green and blue range, however the predominant intensity in the blue range being emitted precisely in the range which is crucial for the circadian effect).

In particular, the light sources, e.g. the four above-mentioned light sources, can also be set up, within the scope of the present invention with suitable selection of the individual emission spectra, such that white light can be produced by the additive superimposition of their individual spectra.

According to a concrete implementation of the invention (for example the LED-illuminated LCD can concern a time-sequentially-controlled liquid crystal screen which correspondingly does not require any color filter attachment, or also an LC screen which is configured with such a color filter attachment), the emission spectra of the individual light sources should be chosen such that metamerism applies directly for the produced light spectrum (e.g. LCD without color filter attachment) or only after passage of the spectra through the corresponding optical elements or filters (e.g. LCD with color filter attachment). Since the absorption spectra of the corresponding optical elements or filters are however known, this is readily possible.

In a further embodiment of the invention, the illumination unit is configured such that, with it, a plurality of different pre-determined light spectra which are respectively metameric to a light spectrum produced without corresponding reduction or increase of intensity ranges can be produced. This can be produced by a different mixture of the components of defined light sources or, for example in the case of the LCD, by a plurality of different sets of respectively four LED light sources (these then respectively having slightly different spectra). The perceived R/G components can also be produced by a combination other than a red and a green LED. The spectral sensitivity curves of the cones are relatively wide in comparison with the emission spectra of the LEDs so that a plurality of differently coloured LEDs "fit" into the sensitivity curve of a cone.

According to the invention, it is hence possible to change the emitted light spectrum after predefined time intervals respectively, without the observer perceiving this since the color stimulus is respectively the same (metameric light spectra). In particular, the spectra can be changed as a function of the time of day.

The present invention hence relates to a display system such as a monitor or even a monitor illumination with a variable light spectrum for influencing the human circadian rhythm while maintaining as extensively as possible the color reproduction. For example, LED-illuminated displays can be modified such that they provide an alternative RGB spectrum. This can be effected for example as a result of the fact that a light diode which has its emission maximum in the range of the circadian, effective blue (i.e. around 460 nm) is replaced by two alternative blue light diodes which have for example emission maxima in the range of approx. 420 nm and 500 nm (the two last-mentioned light diodes should then be configured such that their spectral components in the range of the circadian effective main wavelength of approx. 460 nm are as small as possible).

As an alternative to such LEDs, also other light sources with which the spectral relationships described within the scope of the invention can be produced can however be used (e.g. "white" discharge lamps, i.e. fluorescent lamps with different emission spectra or with a different 464 nm component).

In the present invention, the effect is hence used that different light mixtures can be metamers, i.e. appear the same to the eye although their spectral composition is different. Uncolored components of the picture (in particular white components) can hereby stimulate the circadian photoreceptors by means of a specific spectral composition without changing the perceived color, or even precisely not do this and thus influence the circadian rhythm of the observer. Using the knowledge of the absorption spectra of the K-, M- and L cones (see FIG. 3), again corresponding uncoloured components (in particular: white) are produced by a corresponding adaptation of the green and red emission of the screen.

BRIEF DESCRIPTION OF THE FIGURES

The present invention is described subsequently with reference to two embodiments. There are thereby shown.

DETAILED DESCRIPTION

Figure 4:
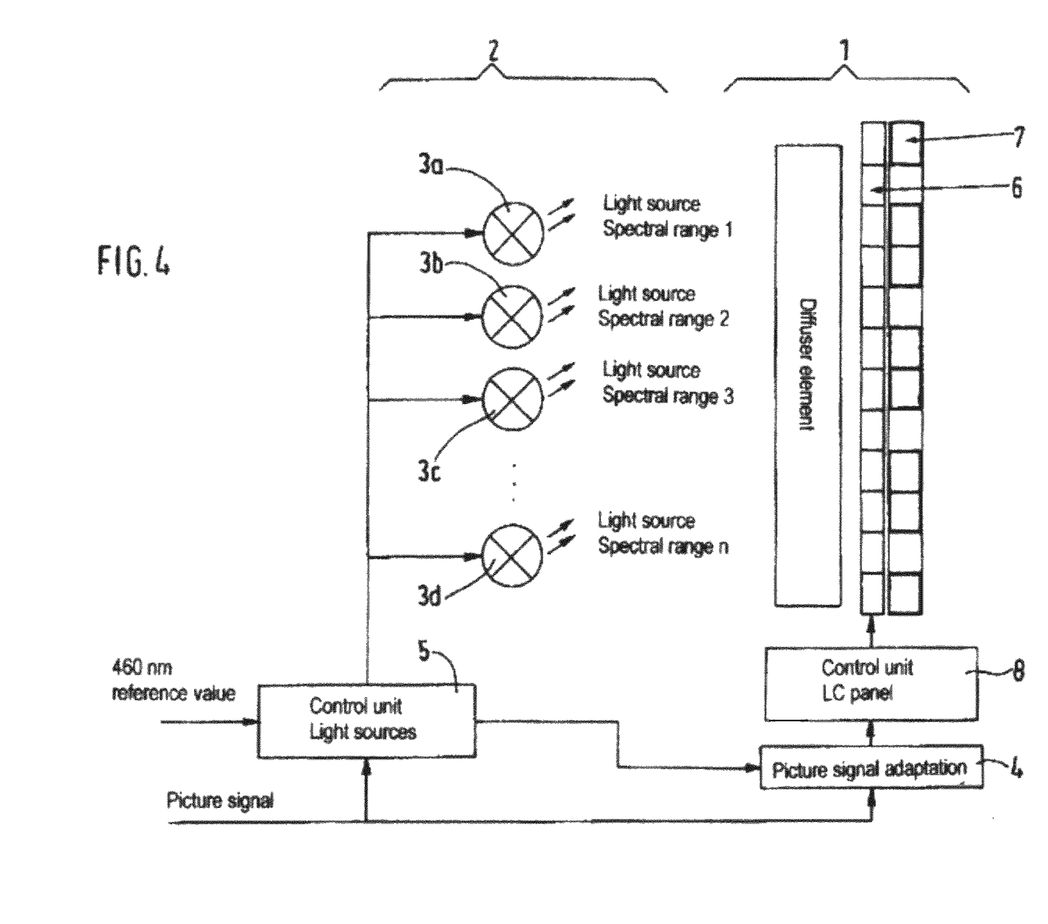
FIG. 4 illustrates a first liquid crystal flat display modified according to the invention (flat display with RGB filters).

FIG. 4 shows, in the illustrated embodiment, an illumination unit 2 which includes here in total four individual light diodes 3a to 3d with respectively a different emission spectrum. The four light diodes 3a to 3d were chosen here such that their emission maximum is at 560 nm (green light diode 3c), at 700 nm (red light diode 3d) and at 420 nm and also at 500 nm (first and second blue light diode 3a and 3b). The two light diodes 3a and 3b were thereby chosen such that respectively their relative light intensities which are emitted in the wavelength range of 460 to 470 nm are less than 5%.

The choice of two LEDs with emission maxima at 420 and at 500 nm ensures that, in the case of that wavelength with maximum circadian effect (approx. 460 nm), practically no intensity components in the emission spectrum are present. This has the effect that, despite minimum melatonin suppression, nevertheless a blue stimulus is present for the human eye so that practically no color perception difference from the conventional illumination results (metameric spectra).

By superimposing the individual intensities or spectra of the four light diodes (RGB color synthesis), the display unit 1 is illuminated. Of course, also more than four light diodes with respectively different emission spectra can be used.

The display unit 1 here has a diffuser element orientated towards the illumination unit 2 or the light diodes 3, with which diffuser element a uniform illumination of the LC cells of the LC panel 6 (consisting of a two-dimensional matrix of such cells) is ensured. In the beam path behind the light sources 3, the diffuser element and the LC cell array 6, an RGB color filter 7 is disposed, which enables the colored display of text- and/or picture information to be displayed correspondingly on the display unit 1. The precise mode of operation of the diffuser element, of the LC cell array and of the RGB color filter is hereby known to the person skilled in the art. The liquid crystal flat display or the actual displaying elements of the display unit 1 were not modified here, hence this can concern a conventional liquid crystal flat display. In particular, the color filters integrated in this flat display for the basic colors red/green/blue (filter 7) were not removed since this is generally not possible without destroying the panel.

According to the invention, the standard backlighting of the panel was however replaced by a controllable illumination, described more subsequently, comprising the illumination unit 2, a control unit 5 for the LEDs of the illumination unit 2 and also a picture signal adaptation unit 4. The LEDs of the illumination unit 2 thereby cover a specific spectral range. In some embodiments, the intensity maxima with an arrangement of four LED groups are at the K/M/L sensitivity maxima, i.e. 420, 534 and 564 nm and also, in the case of the sensitivity maximum of the circadian photoreceptors, i.e. at 464 nm.

In order to achieve uniform illumination of the cell array 6 (via the diffuser element), also a plurality of light sources 3 which are distributed spatially over the surface area of the diffuser element are present for each of the spectral ranges 3a to 3d (not shown here). Instead of the light diodes, also types of lighting means other than light sources can also be used.

All types of lighting means with which the above-described spectral relationships can be achieved, e.g. "white" discharge lamps (fluorescent lamps, 2 different ones, one of which has a larger 464 nm component).

The control unit for the LC panel or flat display (control unit 8) was likewise adopted without change. However, the picture signal adaptation unit 4 is disposed before this control unit. This unit 4 undertakes adaptation of the RGB components of the picture signal as a function of the spectral composition of the emission spectra of the light sources 3a to 3d in order to minimize color deviations. The adaptation can thereby be implemented as follows.

The RGB components are multiplied respectively by a correction factor, non-linearities, caused by characteristics of the light sources and the eye sensitivity, being compensated for by applying corresponding characteristic lines. This can be effected both in the control unit 5 and in the picture signal adaptation unit 4.

In addition, the display system according to the invention has a control unit 5 for the light sources or LEDs, in which the spectral characteristics of the light sources and also the filter characteristics of the color filters 7 are stored. With this information, there can be calculated, for the respectively demanded intensity in the 460 nm range (more precisely in that wavelength range which is crucial for the circadian effect, see above), which is also termed here in a simplified manner "460 nm reference value", that light mixture or that (additively composed) predetermined light spectrum which is desired (fixing the reduction and/or increase in the circadian effective wavelength range according to the invention, the range thereabove and/or the range thereunder (see above)). The individual light sources 3a to 3d can then be actuated (corresponding to the chosen increase and/or reduction degree).

As shown here, the picture signal can also optionally be taken into account during the light mixing by choosing a different spectral composition of the light mixture or a different predetermined light spectrum for picture contents with a high uncolored component (i.e. for text documents). Taking into account the picture signal can be achieved via a continuous statistical evaluation of the current picture content (with as short as possible latent time of the order of magnitude of 1/picture repetition frequency) by the control unit 5 in order to fix the uncolored picture components relative to the entire picture surface area and selection of the other spectral composition when a threshold value is exceeded. Also the spatial distribution of the uncolored components can be taken into account (e.g. large uncolored surface in the picture centre has a higher weight than the uncolored frame).

The other spectral composition is thereby chosen such that it pictures white correctly (however it would lead to color errors in the case of colored displays).

The RGB picture signal is therefore supplied both to the control unit 5 of the LEDs 3 and to the picture signal adaptation unit 4 (and via the latter to the control unit 8 of the LC panel). The control unit 5 delivers an RGB vector which represents the factors with which the RGB components of the picture signal are modulated. This information, as a result of the above-described statistical analysis of the picture signal, is continuously updated.

In order to implement a calibration of the illustrated display system (this is generally required only once during commissioning), a spectrometer can be provided, with which the exact spectral composition of the light spectra emitted by the individual light sources 3 can be determined. The thus determined spectra then allow accurate determination of the intensity mixing or the adjustment of the predetermined light spectrum so that the above-described metamerism occurs.

Figure 5:
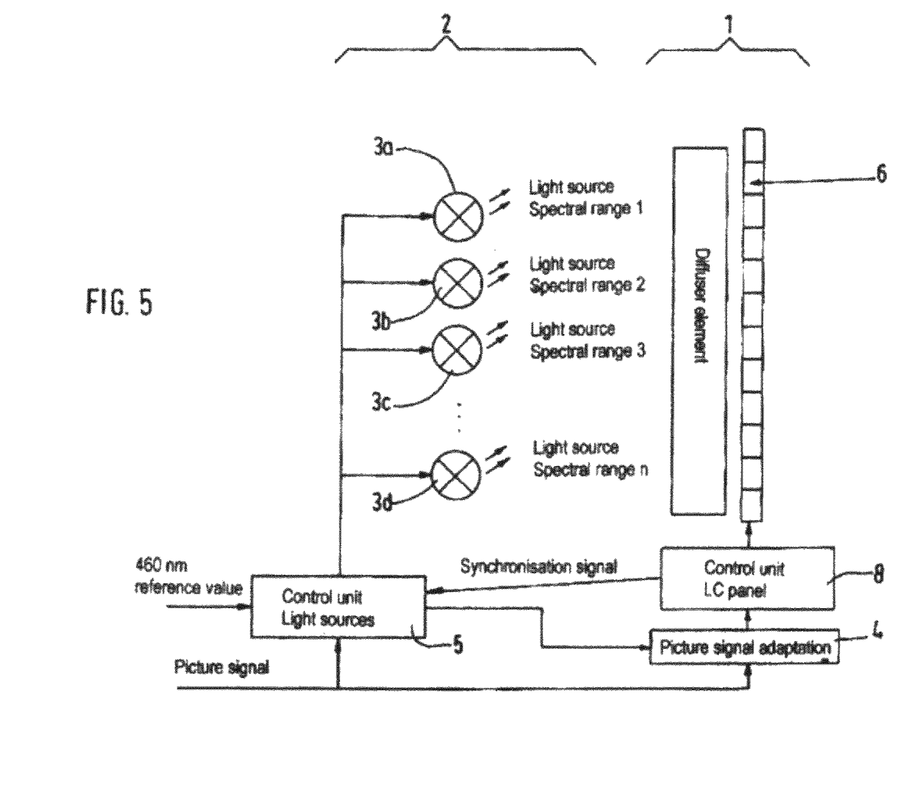
FIG. 5 illustrates a further liquid crystal flat display modified according to the invention (time-sequential flat display without RGB filters).

FIG. 5 shows a further display system according to the invention which differs from the system shown in FIG. 4 merely by the fact that it is constructed on a time-sequential liquid crystal flat display without RGB filter. Subsequently, only the features differing from the example shown in FIG. 4 are therefore described.

In the case of the diagram shown in FIG. 5, color filters are no longer integrated in the LC panel, rather the picture display is effected by time-sequential display of the red, green and blue components of the picture and by backlighting, synchronous thereto, in the corresponding spectral colors (a corresponding method is also applied with single-chip-DLP projectors so that the present invention can be produced also correspondingly in these).

The LC panel must have sufficiently short switching times for this purpose. The switching times must be so short that, in the case of a given picture repetition frequency, each color component (red, green, blue) of the picture can be displayed by the LC panel without being influenced by the preceding color component. In the case of a picture repetition frequency of 60 Hz, this means that the liquid crystals must implement a complete cycle from black to white to black inside $1/180$ s.

The control unit 5 for light sources is synchronized with the control unit 8 of the LC panel in order to ensure correct time-sequential actuation of the individual spectral components.

A sufficiently rapid LC panel thereby also enables the time-sequential display for more basic colors than red, green or blue. This can be used, on the one hand, to extend the color space and, on the other hand, it leads also to a more flexible adaptability of the spectral composition, in the case of the construction according to the invention described here, in particular during evaluation of the picture signal by the control unit 5 for the light sources, as described in the first embodiment.

Extension of the Color Space:

The basic colors used for the color mixing cover a polygon in the CIE color sphere. The more as saturated as possible basic colors are available, the better the shape of this polygon can be adapted to the edge curve of the CIE color space. An example is an LC panel with 5 basic colours (maxima at 420, 500, 520, 550 and 620 nm) which is actuated by a suitable picture signal with 5 components. This can be generated for example by means of computer-graphic methods.

As an alternative to the two described embodiments, the invention can also be produced with projection systems (in particular, beamers with LED background illumination).

According to the invention, the melatonin production in the human body is hence either increased or reduced by specific control of the spectrum radiated by the illumination unit. Concentration, fatigue and vigilance can be influenced by the display system according to the invention.

In particular, an increase or decrease in melatonin suppression can be achieved by changing the light intensity in the range around 460 nm. In order to counteract premature fatigue of an observer, specific dynamics of the control of the illumination unit or of the predetermined light spectrum can be produced.

For example for an average chronotype, a melatonin reduction between 8 and 19 o'clock (between 8 am and 7 pm) and in particular a melatonin increase after 19 o'clock (after 7 pm), in order to achieve relaxation in good time before the sleeping phase.

By means of such dynamics, the working rhythm in everyday working life can be further improved.

An important advantage of the presented display system according to the invention is the practically invisible, but physiologically effective change in the emission spectrum of the display system.

The present invention can thereby be achieved also with OLED-based display systems (or self-illuminating display units): a background illumination which is absolutely essential in the case of transmissive LCD modules is dispensed with here. One advantage with an OLED display is thereby that actually only the actuated pixel is illuminated and the background remains black. By specific adjustment of the emitting color layers of the individual pixels (or illumination sub-units) in the OLED display, different circadian-effective RGB spectra can be provided, which involve barely visible changes in the colors or a barely changed white.

Figure 6:
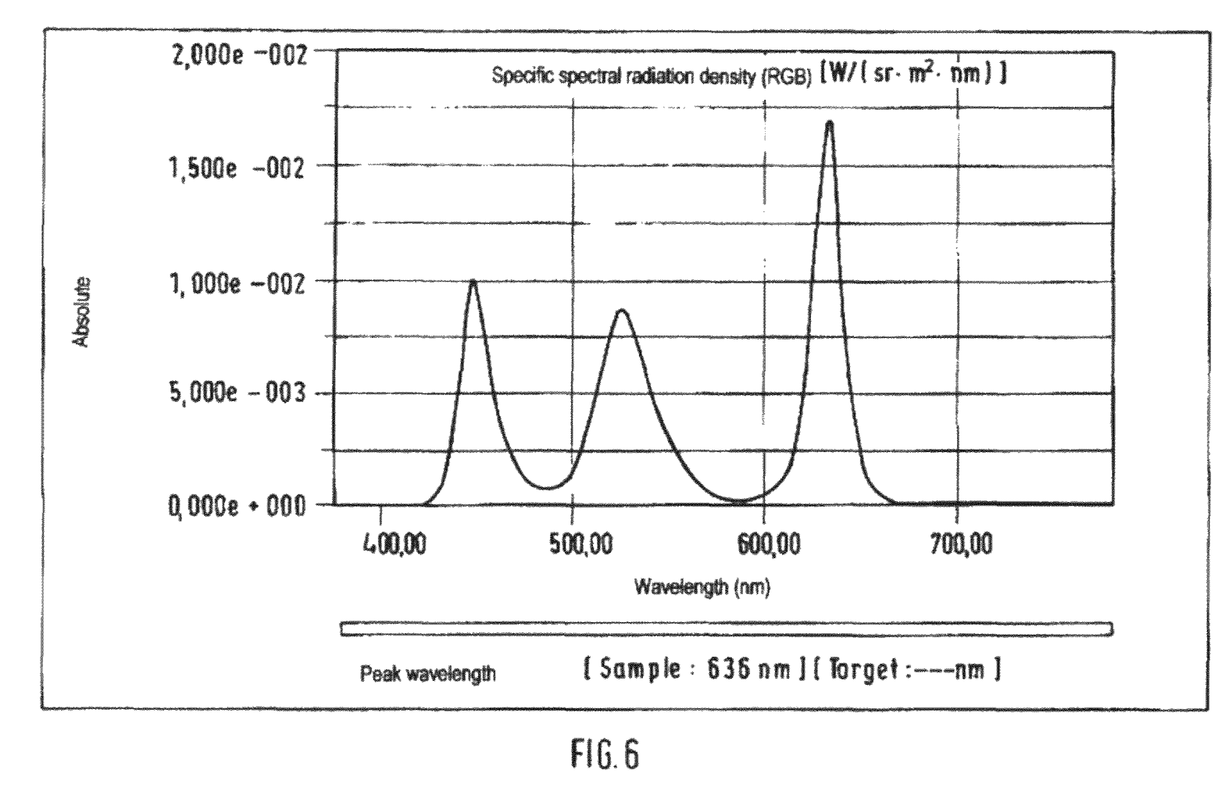
FIGS. 6 to 8 illustrate further aspects of the invention.
Figure 7:
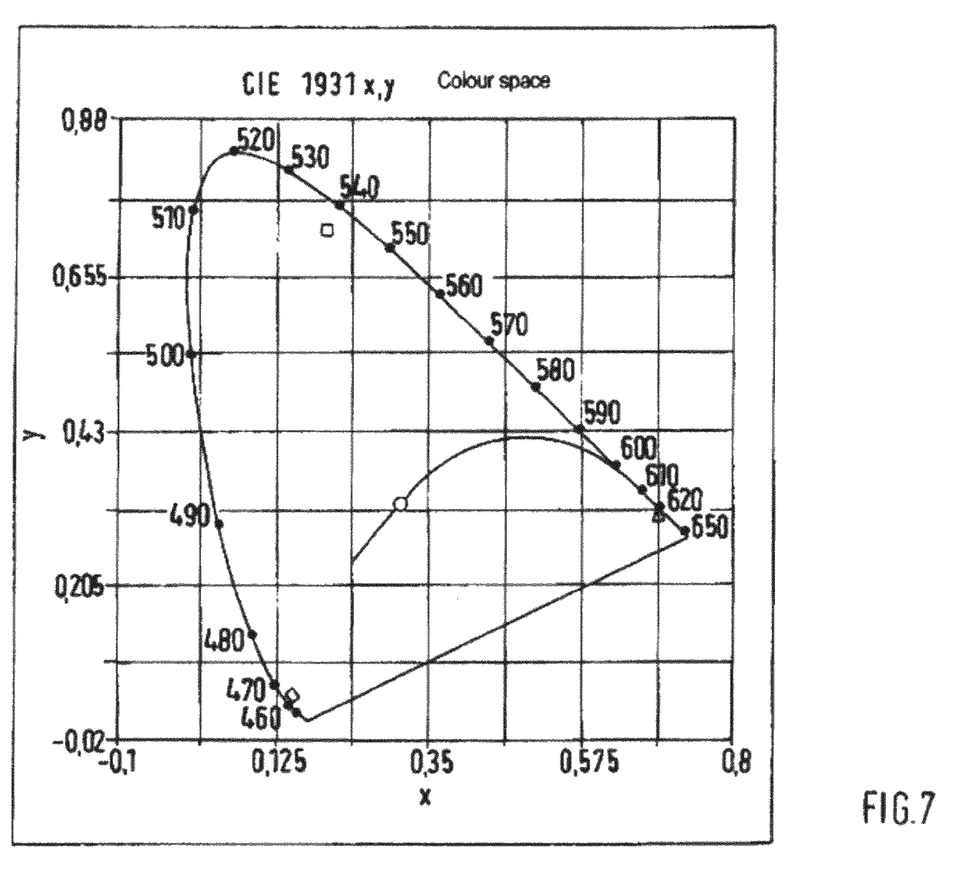
Figure 8:
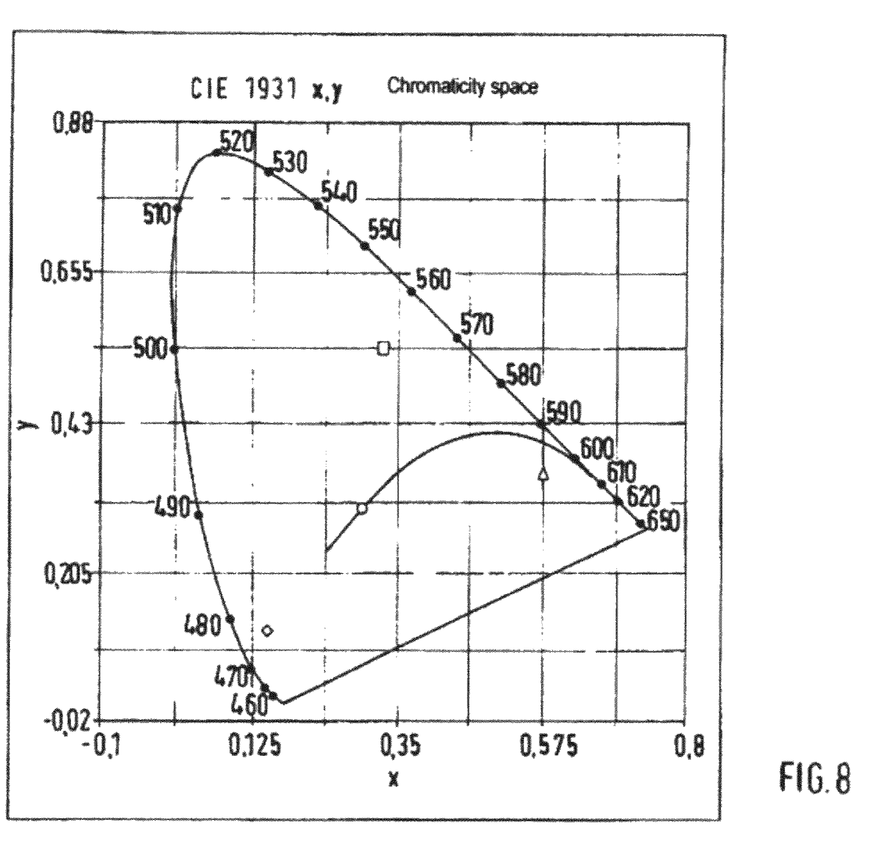

FIGS. 6 to 8 now show further aspects of the invention.

In contrast to FIG. 1, which shows the spectrum of a liquid crystal display with background illumination made of white phosphorus LEDs, FIG. 6 shows the spectrum of background illumination made of RGB LEDs. In comparison to white (phosphorus-coated), LEDs the latter hence have a different spectrum. The three basic colors of the LEDs can be detected clearly in the spectrum (FIG. 6). In contrast thereto, the spectrum of the white LED (FIG. 1) is more uniform over the entire wavelength range.

A display of the RGB spectrum of the LEDs according to FIG. 6 in the CIE 1931 diagram can be seen in FIG. 7 (in contrast, FIG. 8 shows a CIE 1931 diagram of an LCD with white phosphorus LED background illumination or backlight). By mixing the three basic colors differently, the position of the white point situated in the center can be changed. The displayable color space is defined by the corner points of the spanned triangle and can therefore only be effected by moving these corner points (by other basic colors with different saturation, i.e. more or less narrow-band spectrum), but not purely by mixing the existing basic colors.

By specifically controlling the individual colors, a white with a more or less blue component can be produced. This results in a change in the color temperature. In the CIE 1931 diagram, the so-called "white curve" of all color temperatures can be detected.

An extension of the controllable spectrum and a color space which can be displayed consequently enlarged is achieved by using additional colors. Therefore there is, in the meantime, a large number of different spectra of individual LEDs also between the actual R-, B- or G ranges, i.e. for example LEDs with emission maxima at less than 450 nm, at approx. 505 nm, at approx. 590 nm or at approx. 630 nm (Example: Philips Luxeon Rebel Family).

The invention claimed is:

1. A display system for optical display of analog or digital information, comprising:
a display unit and an illumination unit that illuminates the display unit on the basis of an additive or subtractive color synthesis with a predetermined light spectrum; or
an illumination unit that is configured as a self-illuminating display unit which produces the display of the information on the basis of an additive or subtractive color synthesis with a predetermined light spectrum;
wherein a predetermined light spectrum can be produced with the illumination unit, the light intensity of which light spectrum is reduced or increased over the wavelength range of 420 nm to 500 nm relative to the light intensity/intensities above and/or below this wavelength range and/or the light intensity/intensities of which is/are increased above and/or below this wavelength range relative to the light intensity in this wavelength range such that the predetermined light spectrum is metameric to a light spectrum produced without this reduction and/or increase.

2. The display system of claim 1, wherein the additive or subtractive color synthesis comprises an RGB color synthesis and the predetermined light spectrum comprises a background illumination.

3. The display system of claim 1, wherein the average intensity over the wavelength range of 420 nm to 500 nm relative to the average intensity over a wavelength range of the same width which abuts at the top against this wavelength range and/or relative to the average intensity over a wavelength range of the same width which abuts at the bottom against this wavelength range is reduced or increased by at least 10%.

4. The display system of claim 1, wherein the illumination unit has a plurality of individual light sources with respectively different light spectra, the maxima of which differ by at least 10 nm and wherein the predetermined light spectrum can be produced by additive superimposition of the individual light spectra of the light sources.

5. The display system of claim 4, comprising
a first light source that has an emission maximum in the range above 380 nm and below an upper limit of 460 nm, the relative intensity component of light emitted above the upper limit in the light emitted in total being less than 20%;
and/or
a second light source that has an emission maximum in the range below 550 nm and above a lower limit of 470 nm, the relative intensity component of light emitted below the lower limit in the light emitted in total being less than 20%,
and
at least one further light source that has an emission maximum in the green range between 490 and 575 nm and/or in the red range between 650 nm and 750 nm.

6. The display system of claim 5, wherein the first and/or the second light source and also at least one of the further light sources, are configured such that the predetermined light spectrum which is produced and/or can be produced therewith by additive superimposition is metameric with a light spectrum which can be produced by at least one first light source with an emission maximum in the range of 420 nm to 500 nm, by a second light source with an emission maximum in the green range between 490 and 575 nm, and by a third light source with an emission maximum in the red range between 650 nm and 750 nm.

7. The display system of claim 5, wherein the first and/or the second light source and also at least one of the further light sources are configured such that white light can be produced therewith by additive superimposition.

8. The display system of claim 4, wherein the illumination unit with a plurality of individual light sources with respectively different light spectra for at least one of the light spectra, has a plurality of light sources per spectrum, which are disposed spatially at a spacing from each other and produce the respective light spectrum.

9. The display system of claim 4, wherein at least one of the light sources is a light diode.

10. The display system of claim 1, wherein the display unit comprises a two-dimensional array of LCD elements and the illumination unit comprises a background illumination with a plurality of light sources with respectively different light spectra.

11. The display system of claim 1, wherein the illumination unit configured as a self-illuminating display unit comprises a two-dimensional array of a large number of individual illumination sub-units, which can be actuated electrically independently of each other, in the form of organic light diodes (OLEDs), at least one of the illumination sub-unit(s) being configured such that, with it/them, a predetermined light spectrum can thus be produced.

12. The display system of claim 11, wherein the illumination sub-unit(s) comprises/comprise a plurality of individual emission layers.

13. The display system of claim 1, wherein the metamerism of the two light spectra applies directly for producible and/or produced light spectra, i.e. light spectra which are not modified by optical elements in their spectral composition.

14. The display system of claim 1, wherein the metamerism of the two light spectra applies for light spectra which are modified in their spectral composition by at least one optical element.

15. The display system of claim 1, wherein the display system comprises a screen that is selected from the group consisting of a liquid crystal screen (LCD), a color LCD which is time-sequentially controlled or configured with a color filter attachment and/or is LED-illuminated, an OLED screen, a screen of a portable computer, a screen of a mobile radio device, a screen of a PDA, a screen of a projector, and a screen of an LED-illuminated projector.

16. The display system of claim 1, further comprising a picture signal adaptation unit with which the individual additive or subtractive signal components of the color synthesis, which can be supplied and/or is supplied to the display unit, can be modified as a function of the produced predetermined light spectrum.

17. The display system of claim 1, further comprising a control unit which is configured to control the illumination unit with respect to its emitted intensity.

18. The display system of claim 1, wherein the spectral characteristics of the light source and/or the filter characteristics of optical filter elements used in or with the display unit are programmed into the control unit.

19. The display system of claim 1, wherein the control unit is configured to control the emitted intensity of the illumination unit as a function of the picture content which is to be displayed by the display unit.

20. The display system of claim 1, wherein there can be produced with the illumination unit, a plurality of predetermined light spectra which are metameric respectively to a light spectrum produced without a reduction and/or increase.

21. The display system of claim 20, wherein different predetermined light spectra which change respectively after predefined time intervals and/or by a time of day-dependent change in the degree of increase and/or reduction.

22. The display system of claim 1, wherein the illumination unit is connected rigidly or detachably to the display unit.

23. A display method for displaying analog or digital information on a display system comprising:
  producing a predetermined light spectrum on the basis of an additive or subtractive color synthesis using an illumination unit to illuminate a display unit and display the analog or digital information;
  or
  producing a predetermined light spectrum on the basis of an additive or subtractive color synthesis using an illumination unit configured as a self-illuminating display unit to display the analog or digital information;
  wherein a predetermined light spectrum is produced with the illumination unit, the light intensity of which light spectrum is reduced or increased over the wavelength range of 420 nm to 500 nm relative to the light intensity/intensities above and/or below this wavelength range and/or the light intensity/intensities of which is/are increased above and/or below this wavelength range relative to the light intensity in this wavelength range such that the predetermined light spectrum is metameric to a light spectrum produced without this reduction and/or increase.

* * * * *